(12) United States Patent
Yang

(10) Patent No.: US 7,217,652 B1
(45) Date of Patent: May 15, 2007

(54) METHOD OF FORMING HIGHLY CONDUCTIVE SEMICONDUCTOR STRUCTURES VIA PLASMA ETCH

(75) Inventor: Wenge Yang, Fremont, CA (US)

(73) Assignee: Spansion LLC, Sunnyvale, CA (US)

( * ) Notice: Subject to any disclaimer, the term of this patent is extended or adjusted under 35 U.S.C. 154(b) by 128 days.

(21) Appl. No.: 09/805,273

(22) Filed: Mar. 13, 2001

Related U.S. Application Data

(60) Provisional application No. 60/234,523, filed on Sep. 21, 2000, provisional application No. 60/234,522, filed on Sep. 21, 2000.

(51) Int. Cl.
 *H01L 21/4763* (2006.01)
(52) U.S. Cl. .............. 438/628; 438/644; 438/654; 438/720; 257/E21.584; 257/E21.514
(58) Field of Classification Search ............. 438/707, 438/709, 711, 714, 720, 721, FOR. 109, 438/FOR. 117, 644, 654, E21.584, E21.514
See application file for complete search history.

(56) References Cited

U.S. PATENT DOCUMENTS

| | | | | |
|---|---|---|---|---|
| 4,778,563 A | * | 10/1988 | Stone ...................... | 438/714 |
| 5,338,398 A | * | 8/1994 | Szwejkowski et al. ...... | 438/720 |
| 5,645,683 A | * | 7/1997 | Miyamoto .................. | 438/714 |
| 6,037,265 A | * | 3/2000 | Mui et al. .................... | 438/719 |
| 6,074,956 A | * | 6/2000 | Yang et al. ................. | 438/721 |
| 6,124,212 A | * | 9/2000 | Fan et al. .................... | 438/709 |
| 6,159,794 A | * | 12/2000 | Yang et al. ................. | 438/257 |
| 6,191,045 B1 | * | 2/2001 | Yoshigai et al. ............ | 438/714 |
| 6,207,580 B1 | * | 3/2001 | Costaganna ................ | 438/712 |
| 6,277,763 B1 | * | 8/2001 | Kugimiya et al. .......... | 438/720 |
| 6,358,859 B1 | * | 3/2002 | Lo et al. ..................... | 438/712 |
| 6,521,505 B2 | * | 2/2003 | Kawahara ................... | 438/365 |
| 6,639,288 B1 | * | 10/2003 | Kunikiyo ................... | 257/412 |

FOREIGN PATENT DOCUMENTS

| EP | 00932190 A1 | * | 7/1999 |
|---|---|---|---|
| JP | 02084723 A | * | 3/1990 |
| JP | 2002261267 A | * | 9/2002 |
| WO | WO 96/27899 | * | 9/1996 |

* cited by examiner

*Primary Examiner*—Michelle Estrada

(57) ABSTRACT

A process for making semiconductor structures uses a decoupled plasma source to produce a highly selective plasma etchant to form a structure with a thin adhesive layer and overlaying conductive layer. The preferred plasma is formed from chlorine and oxygen feed gases. The highly conductive semiconductor structure has a thickness less than about 3000 Å, preferably less than about 2600 Å, and incorporates an adhesive layer that is preferably less than about 100 Å thick. Despite the reduced profile and topography of the structure, it is more conductive than prior structures, and provides a robust device.

7 Claims, 2 Drawing Sheets

US 7,217,652 B1

METHOD OF FORMING HIGHLY CONDUCTIVE SEMICONDUCTOR STRUCTURES VIA PLASMA ETCH

RELATED APPLICATIONS

This application claims priority to U.S. Provisional Application Ser. No. 60/234,522, filed Sep. 21, 2000, and is related to Provisional Application Ser. No. 60/234,523, filed Sep. 21, 2000, entitled "HIGHLY CONDUCTIVE SEMICONDUCTOR STRUCTURES, METHOD OF FORMING SAME VIA DAMASCENE, AND ELECTRICAL DEVICES INCORPORATING HIGHLY CONDUCTIVE SEMICONDUCTOR STRUCTURES", hereby incorporated by reference.

BACKGROUND

This invention is directed to improved semiconductor devices, and in particular is directed to highly conductive semiconductor structures, such as those formed of tungsten or tungsten silicide, with reduced topographic profiles, and electrical devices incorporating same.

Tungsten (W) or Tungsten silicide (WSi) have desirable conductive and other properties making them useful in forming semiconductor structures, especially bit-line gates. In the past, due to the lack of a sufficiently selective etch process, the process illustrated in FIGS. 1 and 2 was utilized. A layer of tungsten or tungsten silicide 101 was deposited over a layer of polysilicon 102 (also referred to as poly or polySi), which was previously deposited on the substrate 103. Substrate 103 could be an oxide, for example silicon oxide-silicon nitride-silicon oxide (also referred to as ONO), itself on a silicon substrate. The polysilicon layer 102 served as a sacrificial layer to improve the etch process window during etching of the conductive layer, and also enhanced the adhesion of the W or WSi to the substrate. Hence, the polysilicon layer served as both a sacrificial layer and as an adhesive layer between the conductive layer and the substrate.

With reference to FIG. 2, following etching, the resulting conductive structure consists of an upper conductive layer 101a and an intermediate "adhesive" layer 102a on top of substrate 103. If layer 101a is formed of W, and the conductive structure forms a structure such as a bit-line gate, generally the W layer must have a thickness between about 800–2500 angstroms (Å) to be sufficiently conductive to accomplish the desired function. Generally, the intermediate or adhesive layer 102a must be at least 1000 Å to achieve optimal etching, and such previous structures have a thickness greater than about 3000 Å (i.e., the combined thickness of both the adhesive layer and the conductive layer).

However, the resulting structure of a conductive material on top of a polysilicon layer has a higher electrical resistance than desired due to the lower conductivity of the polysilicon with respect to the conductive layer, and further the structure is taller or thicker than desired, increasing the topography of the overall device, making any subsequent processing steps more difficult.

It is thus desired to have more highly conductive semiconductor structures. A highly conductive semiconductor (HCS) structure is defined herein as a structure which has a conductive layer adhered to a substrate by an intermediate adhesive layer, wherein the adhesive layer is conductive but less conductive than the conductive layer, and the conductivity of the overall structure (i.e., the conductive layer and adhesive layer) is higher than previous conductive semiconductor structures formed of a conductive layer and an adhesive layer. In order to reduce electrical resistance, it is necessary to increase the thickness of the conductive layer and/or reduce the thickness of the adhesive layer. However, due to the deficiencies of known etch processes, it was not possible to decrease the thickness of the adhesive layer below about 1000 Å because it also needed to be thick enough to act as an adequate sacrificial layer, and increasing the thickness of the overlying conductive layer was undesirable as this would increase the topography (vertical profile), cost, and overall size of the resulting structure and devices incorporating same. In view of the need for smaller devices, it desirable to reduce the size and increase the conductivity (reduce electrical resistance) of semiconductor structures, and the resulting semiconductor devices and electrical devices incorporating same.

Therefore, there is a need for highly conductive semiconductor structures that have a lower profile with respect to the underlying substrate than previous structures. There is also a need for an improved process of making such structures.

BRIEF SUMMARY

In one aspect the present invention is directed to a low profile conductive structure on a semiconductor device that also has reduced electrical resistance with respect to previous structures designed to perform the same function. In one embodiment, the present invention is directed to a highly conductive semiconductor (HCS) structure having a conductive layer of W or WSi and having a reduced topography or vertical profile with respect to prior semiconductor structures having a W or WSi conductive layer, yet having lower resistance than such prior structures. In a preferred embodiment of the present invention the conductive layer of the highly conductive structure is formed of W or WSi, the adhesive layer is of polysilicon, and the overall structure thickness (i.e., projecting out from the semiconductor substrate) is less than about 3000 Å, yet the conductive structure is thick enough to accomplish the desired function. In alternative preferred embodiments, the overall structure thickness is less than about 2600 Å or less than about 2000 Å, yet the structure is thick enough to accomplish the desired function. In a preferred embodiment the conductive layer is formed of W and has a thickness (i.e., vertically with respect to the underlying substrate) of approximately 2000 Å±500 Å. In a preferred embodiment the adhesive layer is conductive and at most about 100 Å thick, yet thick enough to provide firm adhesion of the conductive layer to the substrate, so that the resulting semiconductor structure will be robust enough to withstand subsequent processing to form a semiconductor device, installation in an electrical device, and use of the electrical device. In a preferred embodiment the adhesive layer has a thickness of between about 10 Å and about 100 Å, and is formed of polysilicon.

In another aspect, the present invention is directed to a new method for forming low profile highly conductive semiconductor structures, and semiconductor devices and electrical devices incorporating same. In a preferred embodiment, a novel plasma etch process is used. A thin adhesive layer is deposited on a substrate, subsequently followed by depositing of a more conductive layer. A highly conductive semiconductor structure is then formed via use of a decoupled plasma source (DPS) etch device, in which the plasma etchant is preferably formed from chlorine and oxygen feed gases. The plasma etchant is very selective for W and WSi on typical semiconductor substrates, thus eliminating the need for the thick (e.g., greater than about 1000 Å) sacrificial layer previously used with prior etch processes.

In a preferred embodiment, the adhesive layer is electrically conductive yet provides for good bonding between typical substrates and more conductive materials, such as W and WSi. Preferably, the adhesive layer is less than about 100 angstroms.

The highly conductive semiconductor structures and semiconductor devices incorporating them are utilized to construct electronic devices. The semiconductor structure of the present invention may be incorporated into a semiconductor device, such as an integrated circuit, for example a memory cell, such as an SRAM, a DRAM, an EPROM, an EEPROM, non-volatile memory device, etc.; a programmable logic device; a data communications device; a clock generation device; etc. Furthermore, any of these semiconductor devices may be incorporated in an electronic device (which term includes an electromechanical device) for example a computer, an airplane, a camera, a television, a mobile telephone, or an automobile.

DETAILED DESCRIPTION

Figure 1:
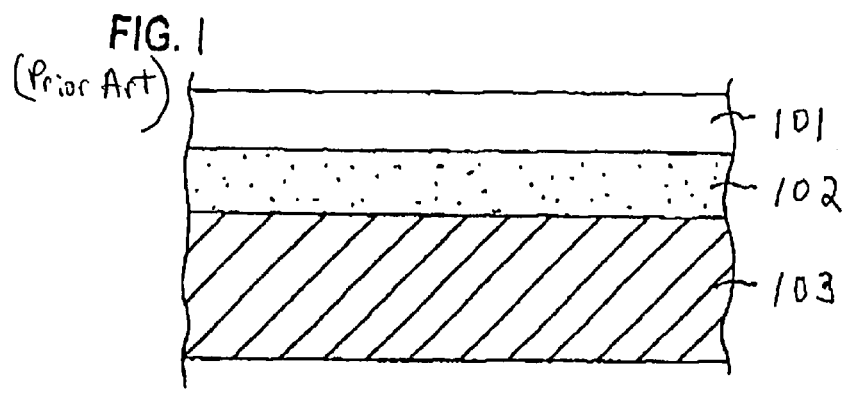
FIG. 1 depicts a cross-sectional view of a more conductive layer bound by an adhesive layer (also electrically conductive but less so) to a substrate.
Figure 2:
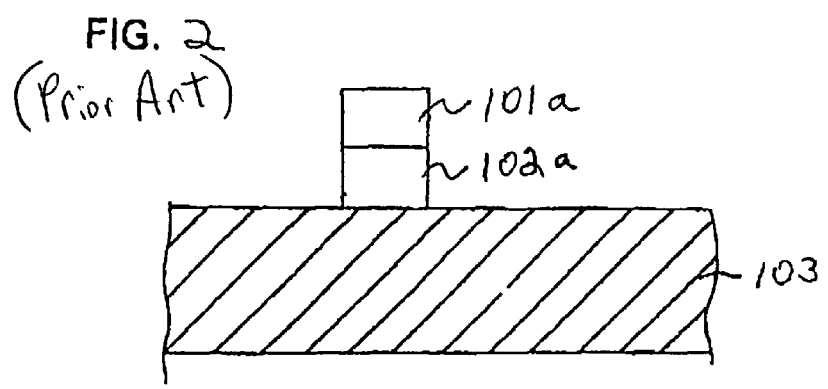
FIG. 2 depicts a cross-sectional view of an electrically conductive structure on a semiconductor device.
Figure 3:
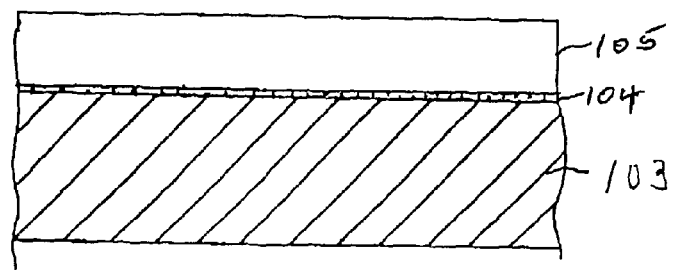
FIG. 3 depicts a cross-sectional view of a conductive layer on a thin adhesive layer that is on a substrate.

Referring to FIG. 3, according to one exemplary embodiment of the present invention, an adhesive layer 104 is provided on a substrate 103.

Adhesive layer 104 must be formed of a conductive material yet also form a good bond to typical substrate materials such as $SiO_2$ or oxide-nitride-oxide substrates commonly used (e.g., silicon oxide—silicon nitride—silicon oxide, otherwise known as ONO). A preferred adhesive is polysilicon, which may be deposited, for example, by CVD.

Preferably adhesive layer 104 is approximately 100 Å in thickness or less, although in less preferred embodiments the adhesive layer may be between about 100 Å and 500 Å in thickness. Preferably, the adhesive layer 104 is always less than about 1000 Å in thickness. The minimum thickness of the adhesive layer is that thickness which is required to provide sufficient adhesion between the substrate and conductive layer for a robust structure, which can withstand subsequent processing into a semiconductor device, testing, incorporation into an electrical device, and usage of the electrical device. The minimum thickness of the adhesive layer will also depend on the material used, the deposition or application process, and polishing or etching applied thereto prior to deposit of a conductive overlayer.

As shown in FIG. 3, a layer of more highly conductive material 105 is deposited over the top of adhesive layer 104. Preferred conductive materials include W, WSi and other materials having high conductivity and meeting the requirements of the resulting semiconductor device.

With regard to techniques for depositing adhesive layer 104 and highly conductive layer 105, conventional methods such as chemical vapor deposition (CVD) may be used. Conventional deposition, patterning, layer removal and/or polishing techniques that may be used with the present invention are well known to those of ordinary skill in the art, and are also described in Encyclopedia of Chemical Technology, Kirk-Othmer, Volume 14, pp. 677–709 (1995); Semiconductor Device Fundamentals, Robert F. Pierret, Addison-Wesley (1996); and Microchip Fabrication, $3^{rd}$ Edition, Peter Van Zant, McGraw-Hill (1997). Conventional chemical mechanical polishing is described in U.S. Pat. Nos. 4,789,648, 4,954,142, and 6,262,354. Conventional etch technologies are also described in U.S. Pat. Nos. 4,403,241 and 4,640,737.

Figure 4:
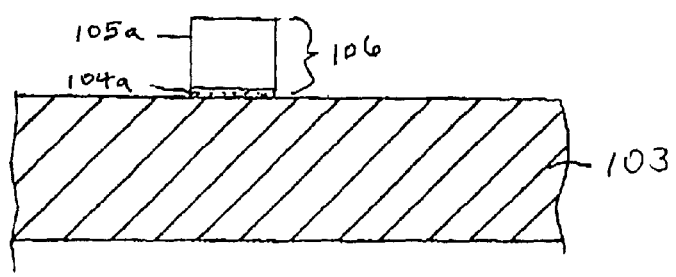
FIG. 4 depicts a cross-sectional view of the structure of FIG. 3 following etching, and illustrates a cross-sectional view of the resulting low profile highly conductive semiconductor structure.

With regard to FIG. 4, following masking, excess conductive layer 105 and excess adhesive layer 104 have been removed using the new etch process of the present invention leaving a reduced conductive layer 105a on reduced adhesive layer 104a. The resulting highly conductive semiconductor structure 106 projects out from substrate 103.

Typical substrates useful herein include but are not limited to various oxides of silicon and aluminum (e.g., $SiO_2$, $Al_2O_3$), on a semiconductor substrate, such as silicon.

In a preferred embodiment, the thickness of structure 106 (i.e., the distance which structure 106 projects out from substrate 103) is less than approximately 3000 Å. In alternative embodiments, the thickness of structure 106 is less than about 2600 Å and preferably is between about 1500 Å and about 2500 Å. Thus for example, a bit-line gate can be formed of W or WSi with the resulting bit-line gate having an average thickness of about 2000 Å, including an adhesive layer of approximately 100 Å or less in thickness. Semiconductor devices incorporating structures, such as structure 106, will have reduced electrical resistance and provide a robust process module.

Decoupled Plasma Source Etch Technology

The present invention preferably utilizes a plasma etchant formed by a decoupled plasma source, DPS. Previously, plasma etchants were prepared in a capacitive reactor, which utilized the electrode's RF electric fields to produce both the plasma (the number of ions) and the direct current bias or wafer sheath potential (the potential which accelerates the ions towards the wafer surface). By increasing RF power, the number of ions is increased and the ion bombardment energy also increases. Thus, ion flux and ion acceleration energy are coupled and cannot be changed independently. Therefore, in a process requiring a high ion flux, the high acceleration energy may cause line width control loss and other disadvantages.

A decoupled plasma source (DPS) etch device does not couple the ion flux and the ion acceleration energy. In a preferred embodiment, the acceleration energy is produced with a first RF source, and the plasma is produced by a second RF source. The second RF source is an inductive source, which couples RF power through a dielectric window rather than an electrode. The power is coupled via RF magnetic fields (not electric fields) from RF current in a coil. These RF magnetic fields penetrate into the plasma and induce RF electric fields that ionize and sustain the plasma. The inductive source primarily influences ion flux. The cathode is biased with RF electric fields to determine the ion acceleration energy. The cathode bias power has little effect on ion flux since its RF power is much lower than the inductive source power and is primarily used to accelerate ions. The second or inductive RF source is not capacitive, so it does not result in coupling of the ion acceleration energy and ion flux. Thus, the combination of an inductive plasma source and a capacitive wafer bias allows independent control of the ion flux and ion energy.

A preferred device for producing a decoupled plasma etchant is available from Applied Materials, Inc., Santa Clara, Calif., USA, and sold as the "SILICON ETCH DPS PLUS CENTURA." The inductive RF source can create a high density plasma by exciting the process gases to create more reactive ions. The process regime recommended for the DPS chamber of the Applied Materials device is 5–90 mTorr. In addition to the process gases required for the desired plasma, a source of nitrogen is needed for purging the chambers before, during, and after wafer processing.

Plasma Etchant

In a preferred embodiment, the process gases utilized for forming a plasma suitable to form the highly conductive semiconductor structures of the present invention are chlorine and oxygen. In a preferred embodiment, highly selective etching of conductive materials, such as W or WSi, on typical semiconductor substrates sufficient to avoid the need for a thick sacrificial layer, was unexpectedly obtained by use of a plasma formed by a DPS device in accordance with the process parameters set forth in Table 1. Note that, despite the process regime of 5–90 mTorr taught by Applied Materials for their device, preferably this invention takes surprising advantage of pressures of only 2–4 mTorr.

TABLE 1

| PROCESS PARAMETER | RANGE |
| --- | --- |
| $Cl_2$ Flow Rate | 40–100 sccm |
| $O_2$ Flow Rate | 4–12 sccm |
| Chamber pressure | 2–4 mTorr |
| Source Power (flux) | 800–1500 Watts |
| Bias Power (acceleration) | 50–150 Watts |

The flow rates of the feed gases (sccm represents standard cubic centimeters per minute), chamber pressure, source power, and bias power can be adjusted within the foregoing ranges to optimize the process depending on the conductive material and substrate used, and the thickness of the conductive material and adhesive layer. In a preferred embodiment, endpoint controls are implemented in which the degree of etching is detected and the etch process terminated when a preselected degree of etching is achieved.

In a preferred embodiment, a DPS etching device, such as an Applied Materials SILICON ETCH DPS PLUS CENTURA device, is used to produce a plasma from a $Cl_2/O_2$ feed gas mixture. A coated wafer, such as that show in FIG. 3, is masked and inserted into the reaction chamber, and etched to form the desired HCS structure. Preferably, the feed gases comprise chlorine at a flow rate of about 40 to about 100 sccm and oxygen at a flow rate of about 4 to about 12 sccm. Preferably, the chamber pressure is preferably about 2 to about 4 mTorr, the plasma flux source power is about 800 watts to about 1500 watts, and the plasma bias power is about 50 watts to about 150 watts. Lower flow rates for the feed gases make it easier to maintain the low chamber pressures of the preferred embodiment.

In a preferred embodiment, a long bit-line gate is formed, having a W or WSi conductive layer on a thin adhesive layer of polysilicon. Preferably, the conductive layer and adhesive layer combined is not more than 3000 Å in thickness, and preferably the adhesive layer is not more than 100 Å in thickness.

In a preferred embodiment a non-volatile memory is constructed utilizing an HCS structure formed in accordance with the method of the present invention, wherein the conductive layer is formed of W or WSi, and has a thickness of approximately 2000 Å±500 Å. In alternative embodiments, the highly conductive semiconductor structures of the present invention are utilized to construct electronic devices, including but not limited to microprocessors, computers, automobiles, and cameras.

Structures of the present invention may increase the speed of the devices into which they are incorporated by up to two times or more. Further, due to their decreased size, the structures of the present invention make possible faster and more powerful electronic devices, which are smaller, use less power, and generate less heat.

Numerous modifications and variations of the present invention are possible in light of the above teachings. It is therefore to be understood that within the scope of the appended claims, the invention may be practiced otherwise than as specifically described herein.

The invention claimed is:

1. A process for making a semiconductor structure comprising:
   depositing a conductive layer upon a substrate comprising a silicon oxide-silicon nitride-silicon oxide (ONO) layer;
   depositing a conductive adhesive layer comprising polysilicon between said substrate and said conductive layer, wherein said conductive adhesive layer has a minimum thickness required to provide adhesion between said substrate and said conductive layer for a robust structure that can withstand subsequent processing, wherein said conductive adhesive layer has a thickness that is greater than 10 and less than or equal to 100 angstroms; and
   etching a portion of said conductive layer and a portion of said conductive adhesive layer utilizing a plasma without sacrificing said substrate, wherein said plasma comprises an etchant, wherein said etchant comprises chlorine and oxygen, wherein said plasma is ionized and sustained by a first RF source, and wherein said plasma is accelerated by a second RF source, wherein said etching is conducted at a pressure of between 2 mTorr and 4 mTorr, wherein a selectivity of said etching obviates a need for an adhesive layer of greater than 100 angstrom thickness, and wherein said process yields a semiconductor structure comprising a lower electrical resistance and a shorter vertical profile than a semiconductor structure comprising a conductive adhesive layer of greater than 100 angstrom thickness.

2. The process of claim 1, wherein said conductive layer and said conductive adhesive layer have a combined thickness of approximately 3000 angstroms or less.

3. The process of claim 1, wherein said conductive layer comprises a material selected from the group consisting of tungsten and tungsten silicide.

4. The process of claim 1, wherein a flow rate of said chlorine is approximately 40 to 100 sccm.

5. The process of claim 1, wherein a flow rate of said oxygen is approximately 4 to 12 sccm.

6. The process of claim 1, wherein said first RF source is approximately 800 to 1500 watts.

7. The process of claim 1, wherein said second RF source is approximately 50 to 150 watts.

* * * * *